(12) United States Patent
Liu et al.

(10) Patent No.: US 10,115,728 B1
(45) Date of Patent: Oct. 30, 2018

(54) LASER SPIKE ANNEALING FOR SOLID PHASE EPITAXY AND LOW CONTACT RESISTANCE IN AN SRAM WITH A SHARED PFET AND NFET TRENCH

(71) Applicant: International Business Machines Corporation, Armonk, NY (US)

(72) Inventors: Zuoguang Liu, Schenectady, NY (US); Gen Tsutsui, Glenmont, NY (US); Heng Wu, Altamont, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 30 days.

(21) Appl. No.: 15/499,084

(22) Filed: Apr. 27, 2017

(51) Int. Cl.
| | |
|---|---|
| H01L 23/535 | (2006.01) |
| H01L 27/11 | (2006.01) |
| H01L 21/8238 | (2006.01) |
| H01L 21/02 | (2006.01) |
| H01L 29/167 | (2006.01) |
| H01L 29/08 | (2006.01) |
| H01L 21/265 | (2006.01) |
| H01L 21/324 | (2006.01) |
| H01L 27/092 | (2006.01) |

(52) U.S. Cl.
CPC .... *H01L 27/1104* (2013.01); *H01L 21/02686* (2013.01); *H01L 21/26506* (2013.01); *H01L 21/324* (2013.01); *H01L 21/823814* (2013.01); *H01L 21/823821* (2013.01); *H01L 27/0924* (2013.01); *H01L 29/0847* (2013.01); *H01L 29/167* (2013.01)

(58) Field of Classification Search
None
See application file for complete search history.

(56) References Cited

U.S. PATENT DOCUMENTS

| | | | |
|---|---|---|---|
| 6,927,461 B2 | 8/2005 | Kim et al. | |
| 7,732,269 B2 * | 6/2010 | Kim | H01L 21/2233 257/200 |
| 8,278,196 B2 | 10/2012 | Huang et al. | |

(Continued)

FOREIGN PATENT DOCUMENTS

WO 2009040707 A2 4/2009

OTHER PUBLICATIONS

Hebb, Ultratech presentation at the NVVAVS West Coast Junction Technology Group Meeting, Jul. 11, 2013, pp. 1-18, www.aysusergroups.org/jtg_pdfs/2013_7hebb.pdf.

*Primary Examiner* — Ali Naraghi
(74) *Attorney, Agent, or Firm* — Cantor Colburn LLP; Vazken Alexanian (57) ABSTRACT

Embodiments are directed to a method of forming a semiconductor device and resulting structures having a shared SRAM trench and a common contact having a low contact resistance. The method includes forming a first semiconductor fin opposite a surface of a substrate and forming a second semiconductor fin opposite the surface of the substrate and adjacent to the first semiconductor fin. A doped region is formed over portions of each of the first and second semiconductor fins and a dielectric layer is formed over the doped regions. A shared trench is formed in the dielectric layer exposing portions of the doped regions. The exposed doped regions are then amorphized and recrystallized.

17 Claims, 8 Drawing Sheets

(56) References Cited

U.S. PATENT DOCUMENTS

| | | |
|---|---|---|
| 8,921,940 B2 | 12/2014 | Kim et al. |
| 9,087,900 B1 | 7/2015 | Kim |
| 9,117,842 B2 | 8/2015 | Wei et al. |
| 9,224,841 B2 * | 12/2015 | Harame ............ H01L 21/76224 |
| 9,478,662 B2 | 10/2016 | Labonte et al. |
| 2003/0096490 A1 | 5/2003 | Borland et al. |
| 2011/0068403 A1 * | 3/2011 | Hattendorf ........ H01L 21/26506 |
| | | 257/347 |
| 2016/0204229 A1 * | 7/2016 | Tsai .................... H01L 29/0847 |
| | | 438/283 |
| 2016/0233164 A1 * | 8/2016 | Choi .................. H01L 27/0924 |
| 2017/0141199 A1 * | 5/2017 | Demuynck ....... H01L 21/28556 |

* cited by examiner

LASER SPIKE ANNEALING FOR SOLID PHASE EPITAXY AND LOW CONTACT RESISTANCE IN AN SRAM WITH A SHARED PFET AND NFET TRENCH

BACKGROUND

The present invention generally relates to fabrication methods and resulting structures for semiconductor devices. More specifically, the present invention relates to laser spike annealing (LSA) for solid phase epitaxy (SPE) and low contact resistance in an SRAM with a shared pFET and nFET trench.

In contemporary semiconductor device fabrication processes a large number of semiconductor devices such as field effect transistors (FETs) are fabricated on a single wafer. Some non-planar device architectures, such as fin field effect transistors (finFETs) and finFET-based static random-access memory (SRAM), employ semiconductor fins and gates that can be contacted outside the active region, resulting in increased device density and some increased performance over lateral devices. A typical finFET device includes a fin that extends upward from the substrate. The gate can be formed over and around a portion of the fin. The portion of the fin that is under the gate defines the channel region of the transistor. The portions of the fin that are not under the gate form the source region and the drain region, respectively.

SUMMARY

Embodiments of the present invention are directed to a method for fabricating a semiconductor device having a shared SRAM trench and a common contact having a low contact resistance. A non-limiting example of the method includes forming a first semiconductor fin opposite a surface of a substrate and forming a second semiconductor fin opposite the surface of the substrate and adjacent to the first semiconductor fin. A doped region is formed over portions of each of the first and second semiconductor fins and a dielectric layer is formed over the doped regions. A shared trench is formed in the dielectric layer exposing portions of the doped regions. The exposed doped regions are then amorphized and recrystallized.

Embodiments of the present invention are directed to a method for fabricating a semiconductor device having a shared SRAM trench and a common contact having a low contact resistance. A non-limiting example of the method includes forming a plurality of semiconductor fins opposite a surface of a substrate. An epitaxy region is formed over each of the plurality of semiconductor fins. A first portion of the epitaxy regions include n-type dopants and a second portion of the epitaxy regions include p-type dopants. The first and second portions are arranged into adjacent pairs of epitaxy regions such that each pair includes a first epitaxy region doped with n-type dopants and a second epitaxy region doped with p-type dopants. A shared trench is formed exposing a portion of the first and second epitaxy regions over each pair. The exposed portions of the first and second epitaxy regions are then amorphized and recrystallized.

Embodiments of the present invention are directed to a semiconductor device having a shared SRAM trench and a common contact having a low contact resistance. A non-limiting example of the device includes a first semiconductor fin formed opposite a surface of a substrate and a second semiconductor fin formed opposite the surface of the substrate and adjacent to the first semiconductor fin. A first doped region having p-type dopants is formed over portions of the first semiconductor fin and a second doped region having n-type dopants is formed over portions of the second semiconductor fin. A shared conductive contact having a contact resistivity of less than about $2.5 \times 10^{-9}$ $\Omega \cdot cm^{-2}$ is formed over the first and second doped regions.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of laminated inductor devices are well known and so, in the interest of brevity, many conventional steps will only be mentioned briefly herein or will be omitted entirely without providing the well-known process details.

Turning now to an overview of technologies that are more specifically relevant to aspects of the invention, as previously noted herein, non-planar device architectures such as the finFET are increasingly relied upon over planar device architectures due to growing device density and performance requirements. FinFET-based static random-access memory (SRAM) architectures, for example, provide a non-planar SRAM topology that is critical beyond the 10 nm node. There are challenges, however, in integrating sub-10 nm finFET technologies into CMOS circuit components such as the SRAM. One such challenge is that sub-10 nm finFET based SRAM layouts require a shared trench for adjacent nFETs and pFETs. Providing a shared trench is not compatible with conventional CMOS doping schemes because conventional masks for nFET and pFET doping rely on an organic planarization layer (OPL) and subsequent RIE to selectively expose either the nFET or pFET after the replacement metal gate (RMG) module, and a sufficiently high aspect ratio OPL RIE is not available for shared pFET/nFET trenches. Moreover, conventional doping schemes (i.e., doping after forming the S/D regions) are susceptible to dopant deactivation during the RMG process, decreasing the active dopant concentration and degrading device performance.

Another challenge in achieving sub-10 nm finFET based SRAM layouts is the corresponding increase in source/drain contact resistance as the fin pitch, which is the centerline-to-centerline distance between corresponding elements (e.g., the fins) of adjacent transistors, is decreased. Increasing contact resistivity causes a loss in device performance. Consequently, future reductions in pitch will require contact resistivities (also known as rhoC or contact resistance) of less than about $2.5 \times 10^{-9}$ $\Omega \cdot cm^{-2}$. Conventional processes, however, result in source/drain contact resistivities of greater than about $3.0 \times 10^{-9}$ $\Omega \cdot cm^{-2}$ (typically about $7.0 \times 10^{-9}$ $\Omega \cdot cm^{-2}$).

Turning now to an overview of the aspects of the invention, one or more embodiments of the invention address the above-described shortcomings by providing methods of fabricating an SRAM device having a shared pFET and nFET trench and a common pFET/nFET contact having a low contact resistance. Prior to the RMG module, source/drain regions over adjacent pFET and nFET semiconductor fins are doped with p-type or n-type dopants for the first time. After this doping process an oxide refill is formed over the doped source/drain regions during a conventional RMG module. Post RMG, a shared pFET/nFET trench is formed over the adjacent pFET and nFET semiconductor fins, wherein the shared trench exposes the doped source/drain regions. The source/drain regions are amorphized using neutral elements (e.g., Ge or Si) in a pre-amorphization ion implantation (PAI). The amorphized source/drain regions are recrystallized using a LSA for SPE process.

In this manner, a doping-RMG-amorphizing-recrystallizing process flow is provided that advantageously bypasses the conventional shared trench doping patterning issue associated with SRAM layouts. Moreover, the combination of a neutral elements PAI amorphization and a LSA for SPE recrystallization reactivates any source/drain regions that were wholly or partially deactivated during the high temperature RMG module, which ensures an active dopant concentration that is relatively higher than that available using conventional processes (providing, i.e., an active dopant concentration of about $7 \times 10^{20}$ $cm^{-3}$ to about $2 \times 10^{21}$ $cm^{-3}$). A further benefit of the neutral elements PAI and LSA for SPE process flow is a low contact resistance. In other words, the process flow results in common contacts having a contact resistance of less than about $2.5 \times 10^{-9}$ $\Omega \cdot cm^{-2}$.

Figure 1:
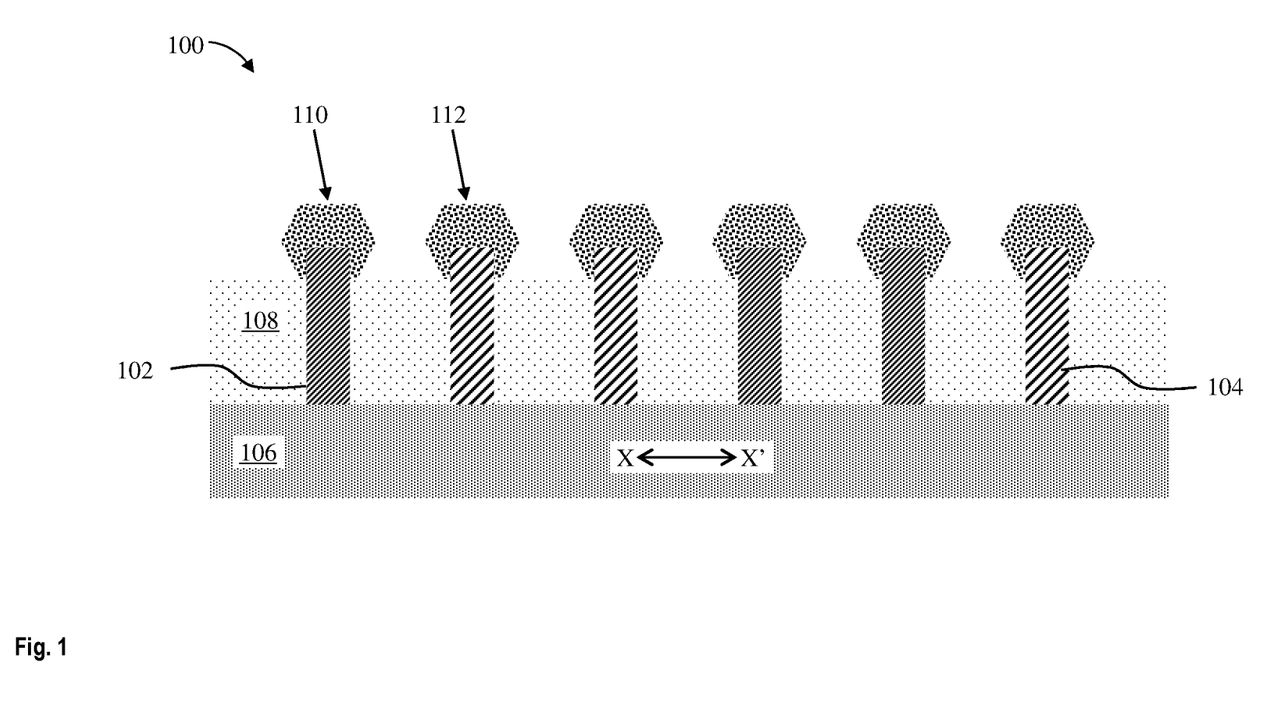
FIG. 1 depicts a semiconductor device after a fabrication operation according to embodiments of the invention.

Turning now to a more detailed description of aspects of the present invention, FIG. 1 depicts a cross-sectional view of a structure 100 along a direction X-X' (perpendicular to fin direction) having nFET semiconductor fins 102 and pFET semiconductor fins 104 formed on a substrate 106 during an intermediate operation of a method of fabricating a semiconductor device according to one or more embodiments of the present invention. The semiconductor fins 102 and 104 can be formed on the substrate 106 using known front-end-of-line (FEOL) finFET fabrication techniques. For example, in some embodiments of the invention, a patterned hard mask (not depicted) is etched to expose portions of the substrate 106. The exposed portions of the substrate 106 can then be removed to form a plurality of semiconductor fins. The patterned hard mask is then removed using an etch process, which can be a wet etch process, a dry etch process or a combination thereof. The semiconductor fins can then be doped with n-type (e.g., As, P, Sb) or p-type dopants (e.g., B, $BF_2$, Al, Ga) to form the nFET semiconductor fins 102 and pFET semiconductor fins 104, respectively. In other embodiments, the nFET semiconductor fins 102 and pFET semiconductor fins 104 are epitaxially grown on the substrate 106.

The nFET semiconductor fins 102 and pFET semiconductor fins 104 can be made of any suitable material, such as, for example, Si, SiGe, Group III-V compound semiconductor, or other suitable materials. Group III-V compound semiconductors include materials having at least one group III element and at least one group V element, such as, for example, one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

The substrate 106 can be made of any suitable substrate material, such as, for example, Si, SiGe, SiC, Group III-V compound semiconductor, Group II-VI compound semiconductor, or semiconductor-on-insulator (SOI). For example, in embodiments where the nFET semiconductor fins 102 and pFET semiconductor fins 104 are made of InGaAs, the substrate 106 can be InP. In some embodiments of the invention, the substrate 106 includes a buried oxide layer (not depicted).

Dielectric layer 108 is formed opposite a surface of the substrate 106 and covers portions of the nFET semiconductor fins 102 and pFET semiconductor fins 104. The dielectric layer 108 can be formed using any known process. In some embodiments of the invention, the dielectric layer 108 is formed using a CVD, PECVD, ALD, PVD, chemical solution deposition, or other like process in combination with a wet or dry etch process. The dielectric layer 108 can be made of any suitable material, such as, for example, a low-k dielectric, a nitride, silicon nitride, silicon dioxide, SiON, SiC, SiOCN, or SiBCN.

Source/drain regions 110 and 112 are formed on exposed portions of the nFET semiconductor fins 102 and pFET semiconductor fins 104, respectively. For ease of illustration, only a single source/drain region 110 or 112 is depicted for each fin. It is understood, however, that a source region and a drain region are provided on opposite sides of a channel region of each fin (not depicted) according to known finFET processes. The source/drain regions 110 and 112 can be formed by any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LP-CVD), limited reaction processing CVD (LRPCVD), and MBE. In some embodiments of the invention, the source/drain regions 110 and 112 include epitaxial semiconductor materials grown from gaseous or liquid precursors. In some embodiments of the invention, epitaxial regions are epitaxially grown over the substrate 106 and/or the nFET semiconductor fins 102 and pFET semiconductor fins 104. Epitaxial semiconductor materials can be grown using vapor-phase epitaxy (VPE), MBE, liquid-phase epitaxy (LPE), or other suitable processes.

The source/drain regions 110 and 112 can be made of any suitable material, such as, for example, Si, SiGe, Group III-V compound semiconductor, or other suitable materials. In some embodiments of the invention, the source/drain regions 110 and 112 are raised source/drain regions formed from III-V compound semiconductor material. In some embodiments of the invention, the gas source for the deposition of epitaxial semiconductor material includes a silicon, a germanium, or a Group III-V compound semiconductor containing gas source, or a combination thereof. For example, an epitaxial InGaAs layer can be deposited from a gas source that is selected from the group consisting of arsine, trimethyl indium, and trimethyl gallium. In another example, an epitaxial germanium layer can be deposited from a germanium gas source that is selected from the group consisting of germane, digermane, halogermane, dichlorogermane, trichlorogermane, tetrachlorogermane and combinations thereof. In yet another example, an epitaxial silicon germanium alloy layer can be formed utilizing a combination of such gas sources. Carrier gases like hydrogen, nitrogen, helium and argon can be used. In some embodiments of the invention, the source/drain regions 110 and 112 include silicon. In some embodiments of the invention, the source/drain regions 110 and 112 include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Figure 2:
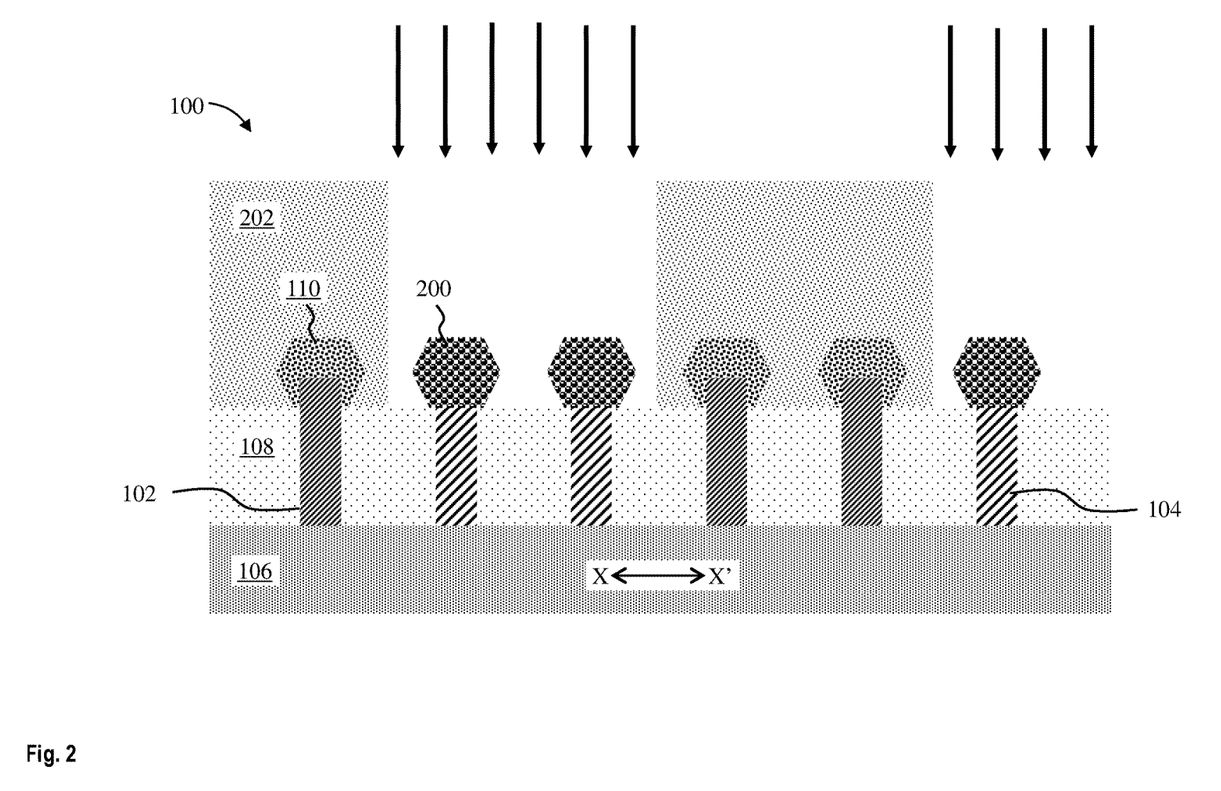
FIG. 2 depicts a semiconductor device after a fabrication operation according to embodiments of the invention.
Figure 3:
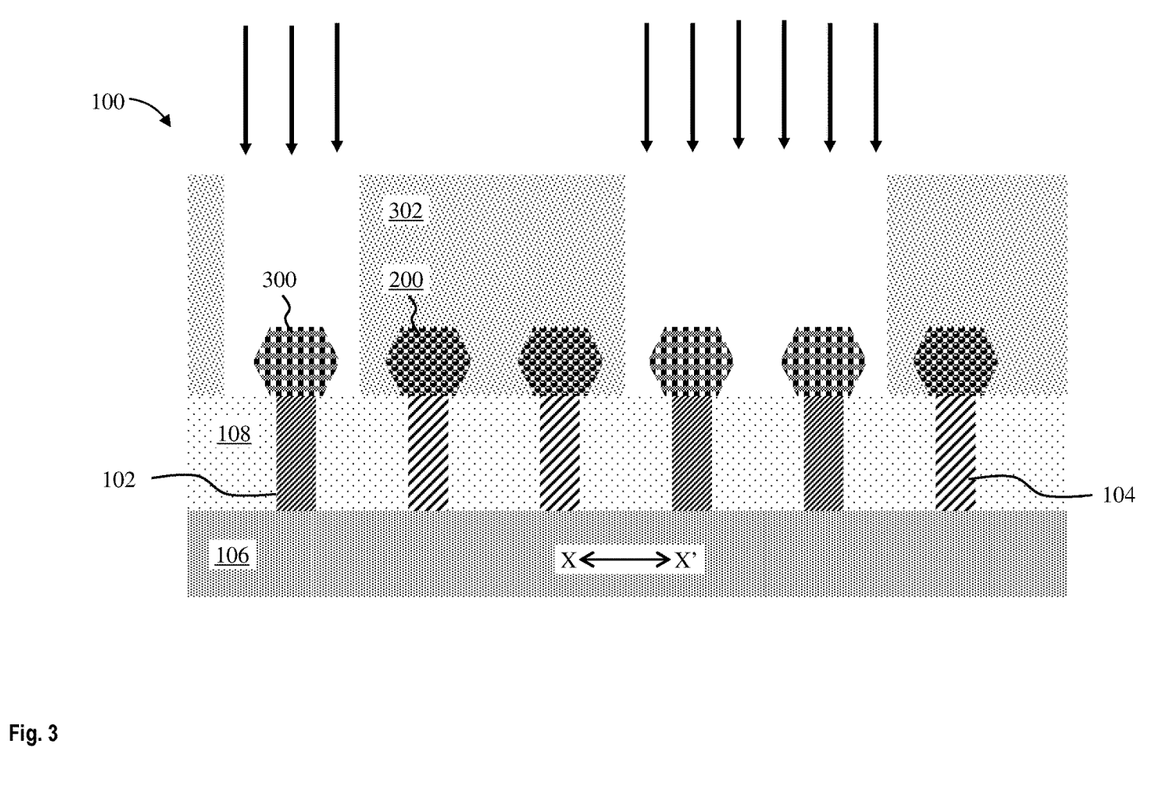
FIG. 3 depicts a semiconductor device after a fabrication operation according to embodiments of the invention.

FIG. 2 illustrates a cross-sectional view of the structure 100 along the direction X-X' after doping the source/drain regions 112 to form p-doped regions 200 over the pFET semiconductor fins 104 during an intermediate operation of a method of fabricating a semiconductor device according to one or more embodiments of the present invention. The source/drain regions 112 can be doped by a variety of methods, such as, for example, in-situ doped epitaxy, doped following the epitaxy, or by implantation and plasma doping. In some embodiments of the invention of the invention, the source/drain regions 112 are doped using a blanket p-type dopant (e.g., B, $BF_2$, Al, Ga) ion implantation process. In some embodiments of the invention, a block mask 202 (e.g., an OPL) is formed over the nFET semiconductor fins 102 and the source/drain regions 110 prior to the blanket p-type dopant implantation to prevent p-type doping of the nFET semiconductor fins 102. In some embodiments of the invention, the p-type doping concentration in the p-doped regions 200 can range from $1 \times 10^{19}$ cm$^{-3}$ to $5 \times 10^{21}$ cm$^{-3}$, or between $1 \times 10^{20}$ cm$^{-3}$ and $5 \times 10^{21}$ cm$^{-3}$. The depth of the p-type dopant ion implantation into the p-doped regions 200 is controlled by adjusting the implantation energy. For ease of illustration the p-type dopant implantation is depicted as occurring prior to the n-type dopant implantation (as depicted in FIG. 3). It is understood, however, that implantation order can be reversed with the n-type dopant implantation occurring first.

FIG. 3 illustrates a cross-sectional view of the structure 100 along the direction X-X' after doping the source/drain regions 110 to form n-doped regions 300 over the nFET semiconductor fins 102 during an intermediate operation of a method of fabricating a semiconductor device according to one or more embodiments of the present invention. The source/drain regions 110 can be doped by a variety of methods, such as, for example, in-situ doped epitaxy, doped following the epitaxy, or by implantation and plasma doping. In some embodiments of the invention, the source/drain regions 110 are doped using a blanket n-type dopant (e.g., As, P, Sb) ion implantation process. In some embodiments of the invention, a block mask 302 (e.g., an OPL) is formed over the pFET semiconductor fins 104 and the p-doped regions 200 (or alternatively over the source/drain regions 112 in embodiments where the n-type dopant implantation occurs first) prior to the blanket n-type dopant implantation to prevent n-type doping of the pFET semiconductor fins 104. In some embodiments of the invention, the n-type doping concentration in the n-doped regions 300 can range from $1 \times 10^{19}$ cm$^{-3}$ to $5 \times 10^{21}$ cm$^{-3}$, or between $1 \times 10^{20}$ cm$^{-3}$ and $5 \times 10^{21}$ cm$^{-3}$. The depth of the n-type dopant ion implantation into the n-doped regions 300 is controlled by adjusting the implantation energy.

Figure 4:
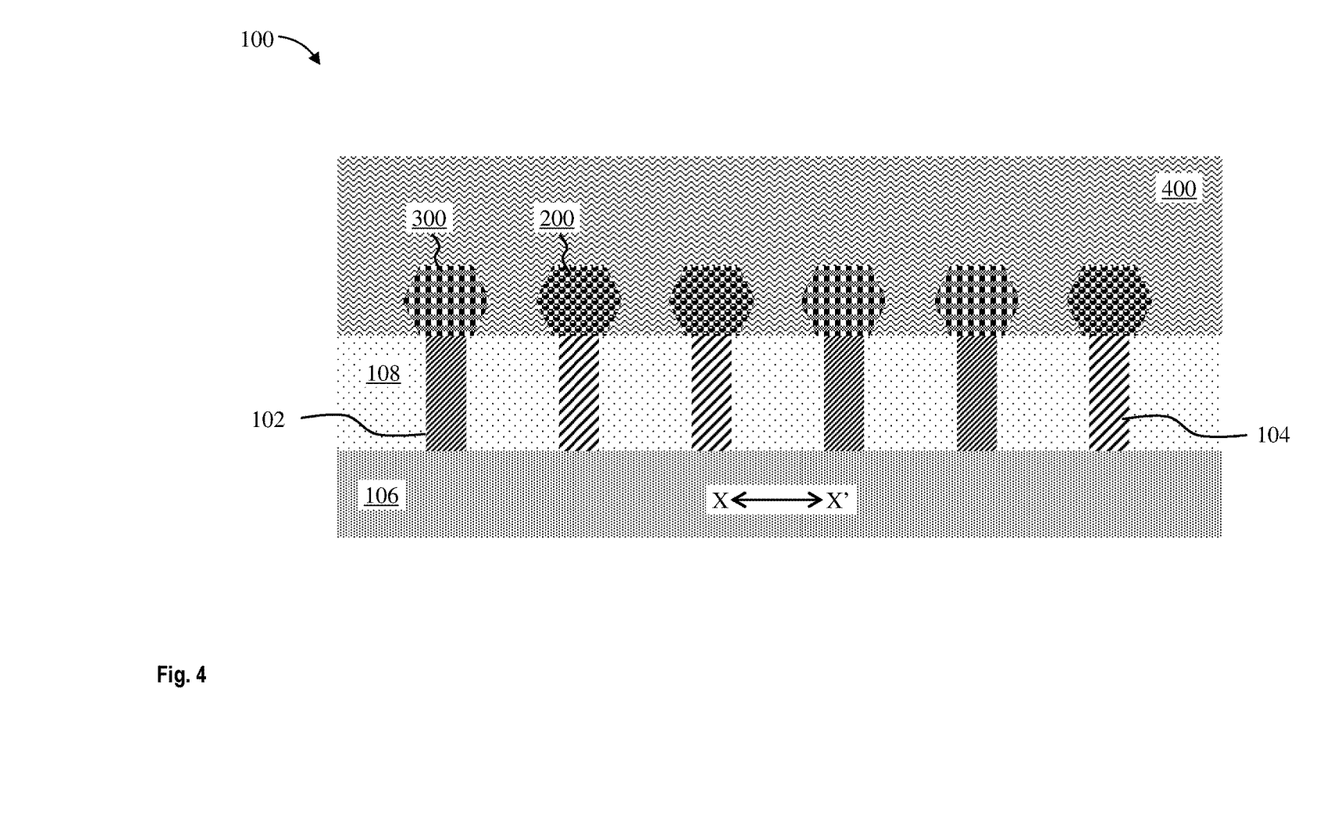
FIG. 4 depicts a semiconductor device after a fabrication operation according to embodiments of the invention.

FIG. 4 illustrates a cross-sectional view of the structure 100 along the direction X-X' after forming a dielectric layer 400 opposite a surface of the dielectric layer 108 during an intermediate operation of a method of fabricating a semiconductor device according to one or more embodiments of the present invention. In some embodiments of the invention, the dielectric layer 400 is formed during a RMG module using known front-end-of-line (FEOL) finFET fabrication techniques.

The dielectric layer 400 is formed after implanting the source/drain regions 110 and 112 with p-type dopants (as depicted in FIG. 2) and n-type dopants (as depicted in FIG. 3). In this manner, the dielectric layer 400 (also known as an oxide refill) protects the p-doped regions 200 and n-doped regions 300 from the high processing temperatures associated with the RMG module.

Figure 5:
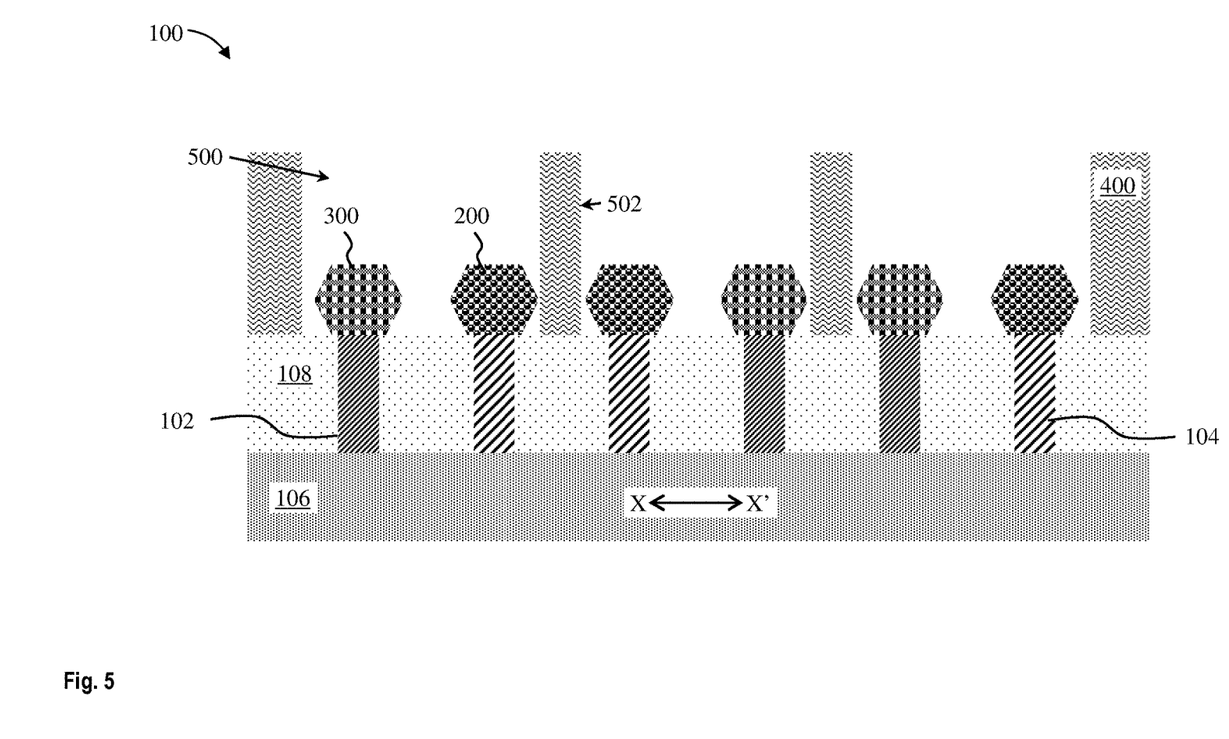
FIG. 5 depicts a semiconductor device after a fabrication operation according to embodiments of the invention.

FIG. 5 illustrates a cross-sectional view of the structure 100 along the direction X-X' after removing portions of the dielectric layer 400 to form shared pFET/nFET trenches (hereinafter shared trenches 500) during an intermediate operation of a method of fabricating a semiconductor device according to one or more embodiments of the present invention. As previously noted, SRAM layouts require a shared trench for adjacent nFETs and pFETs. The shared trenches 500 are formed over each pair of adjacent nFET and pFET fins (i.e., each of the shared trenches 500 exposes portions of both a p-doped region and an n-doped region). As discussed previously herein, the dielectric layer 400 is formed after implanting the source/drain regions 110 and 112. Consequently, no doping ions (p-type or n-type) are formed in the portion 502 of the dielectric layer 400 remaining between adjacent shared trenches 500.

Figure 6:
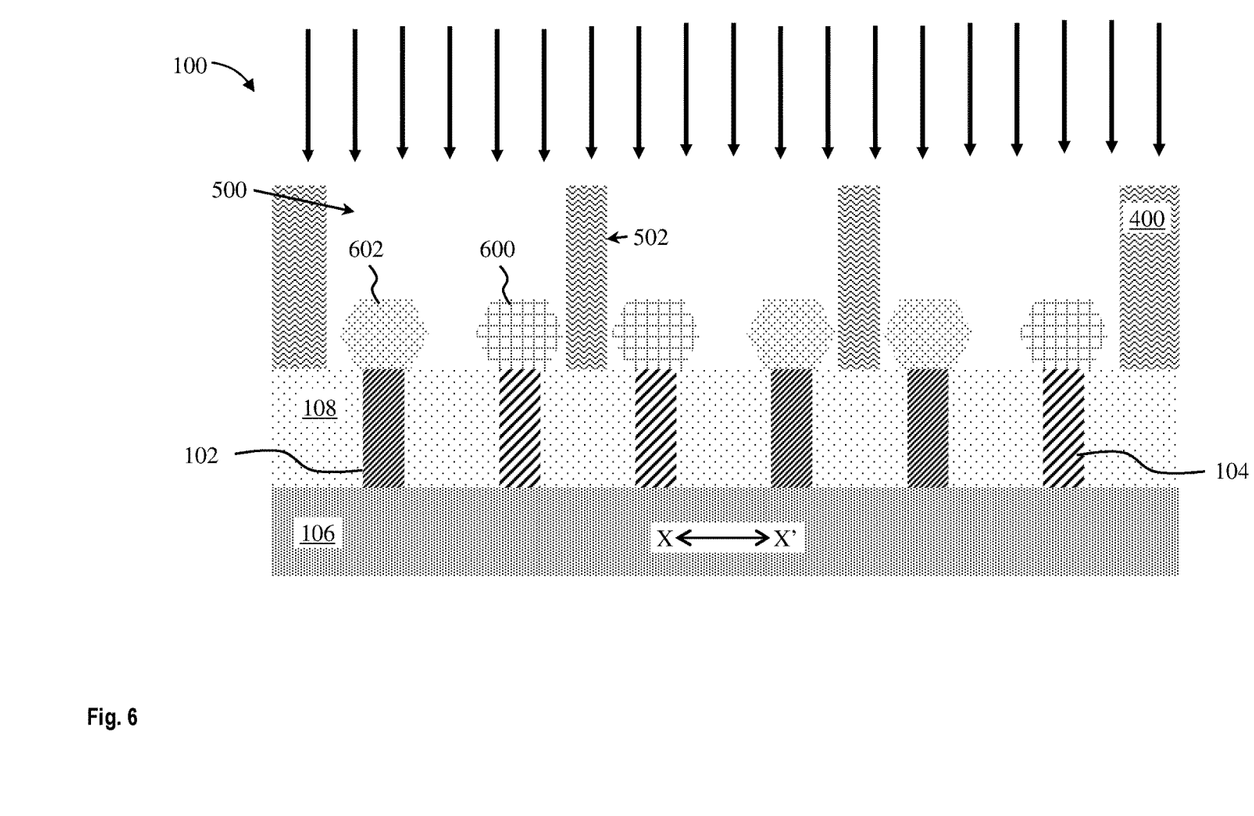
FIG. 6 depicts a semiconductor device after a fabrication operation according to embodiments of the invention.

FIG. 6 illustrates a cross-sectional view of the structure 100 along the direction X-X' after a neutral elements PAI during an intermediate operation of a method of fabricating a semiconductor device according to one or more embodiments of the present invention. The neutral elements PAI serves to amorphize the p-doped regions 200 and n-doped regions 300, forming amorphized p-doped regions 600 and amorphized n-doped regions 602, respectively. In some embodiments of the invention, a Ge PAI amorphizes the p-doped regions 200 and n-doped regions 300. In some embodiments of the invention, a Si PAI amorphizes the p-doped regions 200 and n-doped regions 300. In some embodiments of the invention, the neutral elements PAI forms neutral element dopants in the amorphized p-doped regions 600 and amorphized n-doped regions 602. In some embodiments of the invention, the neutral element is Ge and the Ge concentration in the amorphized p-doped regions 600 can be greater than about $1 \times 10^{21}$ cm$^{-3}$. In some embodiments of the invention, the neutral element is Ge and the Ge concentration in the amorphized n-doped regions 602 can be greater than about $2 \times 10^{21}$ cm$^{-3}$.

Figure 7:
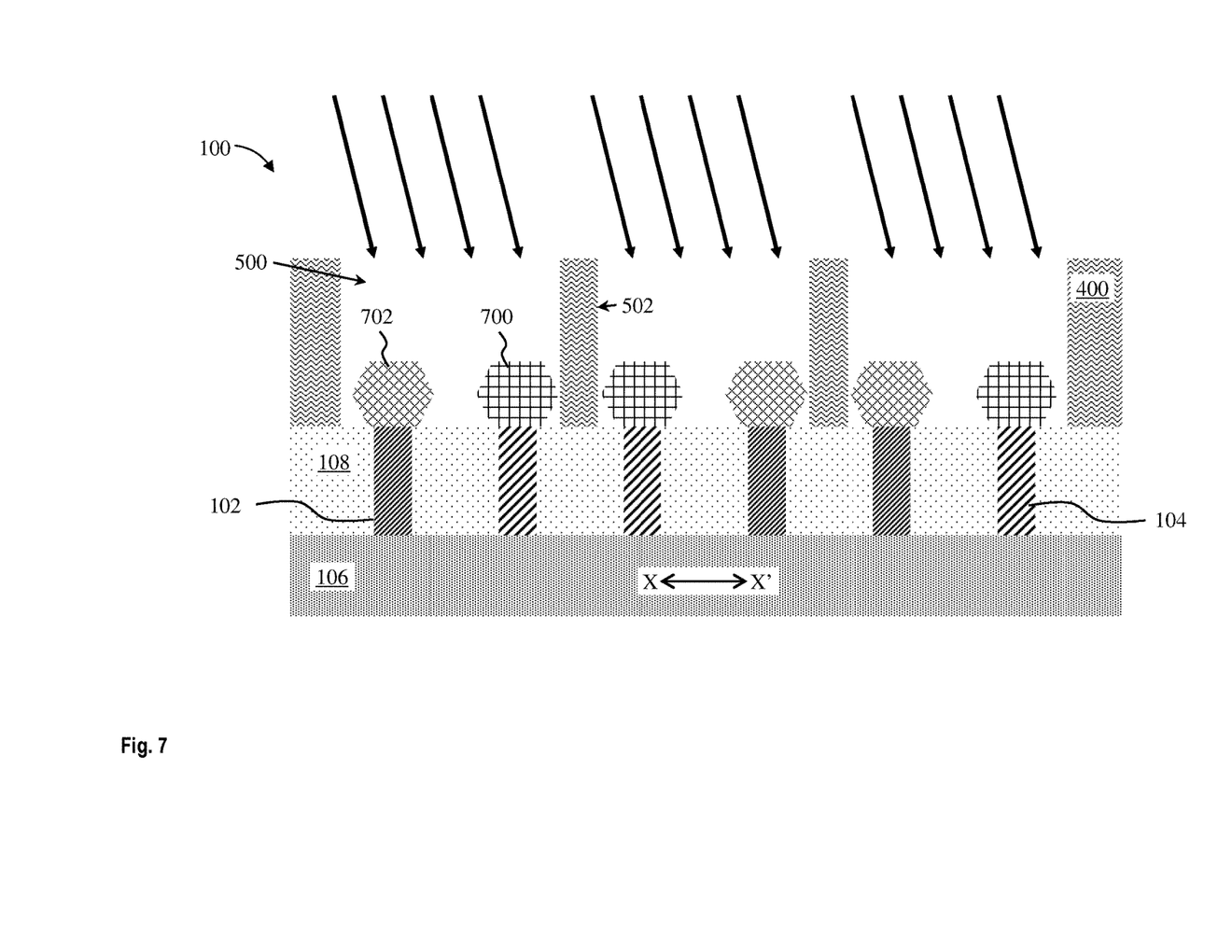
FIG. 7 depicts a semiconductor device after a fabrication operation according to embodiments of the invention.

FIG. 7 illustrates a cross-sectional view of the structure 100 along the direction X-X' after a LSA SPE process during an intermediate operation of a method of fabricating a semiconductor device according to one or more embodiments of the present invention. Any suitable LSA SPE process can be used, such as, for example, a 900 nanosecond LSA or a millisecond LSA. As discussed previously herein, the RMG process can cause dopants to become partially or wholly deactivated, causing a loss in active dopant concentration that degrades device quality. The LSA SPE process causes the amorphized p-doped regions 600 and amorphized n-doped regions 602 to recrystallize, forming recrystallized p-doped regions 700 and recrystallized n-doped regions 702, respectively. Consequently, the crystallized p-doped regions 700 and recrystallized n-doped regions 702 have a crystalline or poly-crystaline structure. This recrystallization reactivates the dopants and ensures a high active dopant concentration (i.e., an active dopant concentration in the recrystallized p-doped regions 700 of at least $1 \times 10^{21}$ cm$^{-3}$ and an active dopant concentration in the recrystallized n-doped regions 702 of at least $1 \times 10^{21}$ cm$^{-3}$).

Following the LSA SPE, common conductive contacts (also known as shared contacts, not depicted) can be formed or deposited using known finFET metallization techniques into the shared trenches 500. The LSA SPE recrystallization process allows for the common conductive contacts formed in the shared trenches 500 achieve a contact resistance of less than about $2.5 \times 10^{-9}$ $\Omega \cdot$cm$^{-2}$.

In some embodiments of the invention, the contacts are overfilled into the shared trenches 500, forming overburdens above a surface of the dielectric layer 400. In some embodiments of the invention, a CMP selective to the dielectric layer 400 removes the overburden. The contacts can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the invention, the contacts can be copper and can include a barrier metal liner. The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

Figure 8:
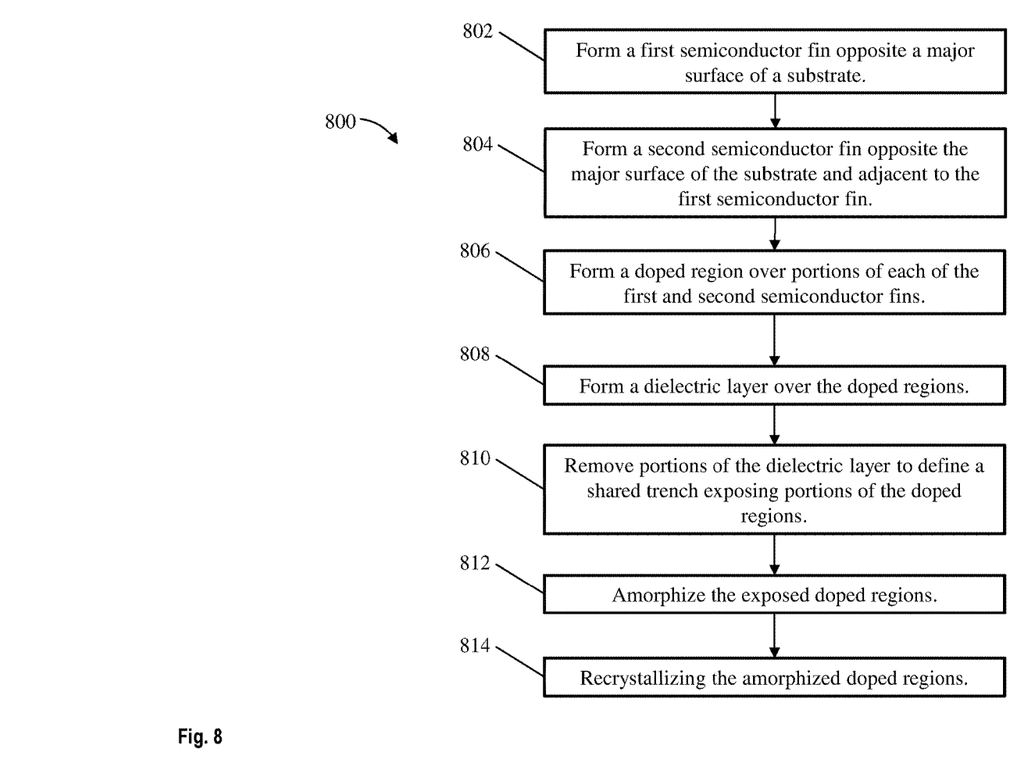
FIG. 8 depicts a flow diagram illustrating a method according to one or more embodiments of the invention.

FIG. 8 depicts a flow diagram illustrating a method for forming a semiconductor device according to one or more embodiments of the invention. As shown at block 802, a first semiconductor fin is formed opposite a surface of a substrate. At block 804 a second semiconductor fin is formed opposite the surface of the substrate and adjacent to the first semiconductor fin. The first and second semiconductor fins can be formed using known front-end-of-line (FEOL) finFET fabrication techniques according to one or more embodiments.

As shown at block 806, a doped region is formed over portions of each of the first and second semiconductor fins. The doped regions can be formed using p-type dopants (as depicted in FIG. 2) and n-type dopants (as depicted in FIG. 3), according to one or more embodiments.

As shown at block 808, a dielectric layer is formed over the doped regions. The dielectric layer can be formed in a similar manner as the dielectric layer 400 (as depicted in FIG. 4) according to one or more embodiments.

As shown at block 810, portions of the dielectric layer are removed to define a shared trench exposing portions of the doped regions. The shared trench can be formed in a similar manner as the shared trenches 500 (as depicted in FIG. 5) according to one or more embodiments. As previously noted, SRAM layouts require a shared trench for adjacent nFETs and pFETs. The shared trench is formed over adjacent nFET and pFET fins (i.e., the shared trench exposes portions of both a p-doped region and an n-doped region).

As shown at block 812, the exposed doped regions in the shared trench are amorphized. As discussed previously herein, the doped regions can be amorphized using a neutral elements PAI (as depicted in FIG. 6) according to one or more embodiments.

As shown at block 814, the doped regions in the shared trench are recrystallized. As discussed previously herein, the doped regions can be recrystallized using a LSA SPE process (as depicted in FIG. 7) according to one or more embodiments.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for fabricating a semiconductor device, the method comprising:
    forming a first semiconductor fin opposite a surface of a substrate;
    forming a second semiconductor fin opposite the surface of the substrate and adjacent to the first semiconductor fin;
    prior to forming a replacement metal gate (RMG), forming a first doped region over portions of the first semiconductor fin and a second doped region over portions of the second semiconductor fin;
    forming a dielectric layer over the first and second doped regions;
    after forming the RMG, forming a shared trench in the dielectric layer exposing portions of the first and second doped regions;
    concurrently amorphizing the exposed first and second doped regions; and
    concurrently recrystallizing the amorphized first and second doped regions.

2. The method of claim 1, wherein the first semiconductor fin comprises n-type dopants and the second semiconductor fin comprises p-type dopants.

3. The method of claim 2, wherein the n-type dopants are selected from the group consisting of As, P, and Sb.

4. The method of claim 2, wherein the p-type dopants are selected from the group consisting of B, $BF_2$, Al, and Ga.

5. The method of claim 1, wherein forming the first doped region over portions of the first semiconductor fin further comprises:
    forming a first epitaxy region over the first semiconductor fin; and
    doping the first epitaxy region with n-type dopants.

6. The method of claim 5, wherein forming the second doped region over portions of the second semiconductor fin further comprises:
    forming a second epitaxy region over the second semiconductor fin; and
    doping the second epitaxy region with p-type dopants.

7. The method of claim 1, wherein amorphizing the exposed doped regions further comprises exposing the doped regions to a neutral element pre-amorphization ion implantation (PAI).

8. The method of claim 7, wherein the neutral element PAI comprises Ge or Si dopants.

9. The method of claim 1, wherein recrystallizing the amorphized doped regions further comprises exposing the doped regions to a laser spike anneal for solid phase epitaxy (LSA SPE) process.

10. The method of claim 9, wherein the recrystallized doped regions each comprise a dopant concentration of about $7\times10^{20}$ $cm^{-3}$ to about $2\times10^{21}$ $cm^{-3}$.

11. A method for fabricating a semiconductor device, the method comprising:
    forming a plurality of semiconductor fins opposite a surface of a substrate;
    forming an epitaxy region over each of the plurality of semiconductor fins, a first portion of the epitaxy regions comprising n-type dopants and a second portion of the epitaxy regions comprising p-type dopants, the first and second portions arranged into adjacent pairs of epitaxy regions comprising a first epitaxy region doped with n-type dopants and a second epitaxy region doped with p-type dopants;
    prior to forming a replacement metal gate (RMG), forming a shared trench exposing a portion of the first and second epitaxy regions over each pair;
    concurrently amorphizing the epitaxy regions; and
    concurrently recrystallizing the epitaxy regions.

12. The method of claim 11, wherein the n-type dopants are selected from the group consisting of As, P, and Sb.

13. The method of claim 11, wherein the p-type dopants are selected from the group consisting of B, $BF_2$, Al, and Ga.

14. The method of claim 11, wherein amorphizing the epitaxy regions further comprises exposing the epitaxy regions to a neutral element pre-amorphization ion implantation (PAI).

15. The method of claim 14, wherein the neutral element PAI comprises Ge or Si dopants.

16. The method of claim 11, wherein recrystallizing the epitaxy regions further comprises exposing the epitaxy regions to a laser spike anneal for solid phase epitaxy (LSA SPE) process.

17. The method of claim 16, wherein the recrystallized epitaxy regions each comprise a dopant concentration of about $7\times10^{20}$ $cm^{-3}$ to about $2\times10^{21}$ $cm^{-3}$.

* * * * *